United States Patent
Wong-Lam et al.

(10) Patent No.: US 6,809,662 B2
(45) Date of Patent: Oct. 26, 2004

(54) MODULATION CODE SYSTEM AND METHODS OF ENCODING AND DECODING A SIGNAL BY MULTIPLE INTEGRATION

(75) Inventors: Ho Wai Wong-Lam, Sunnyvale, CA (US); Kornelis Antonie Schouhamer Immink, Rotterdam (NL); Cornelis Marinus Johannes Van Uijen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/234,888

(22) Filed: Sep. 4, 2002

(65) Prior Publication Data

US 2003/0107504 A1 Jun. 12, 2003

(30) Foreign Application Priority Data

Sep. 5, 2001 (EP) ............................................ 01203346

(51) Int. Cl.[7] .............................................. H03M 7/00
(52) U.S. Cl. ........................................................ 341/59
(58) Field of Search ............................... 341/59, 50, 58, 341/68, 69, 70, 71, 72, 73

(56) References Cited

U.S. PATENT DOCUMENTS 6,052,072 A * 4/2000 Tsang ........................... 341/59

OTHER PUBLICATIONS

J.W.M. Bergmans et al; "Antiwhistle codes", IEEE Transctions on Communicatins, vol. 45, No. Aug. 8,1997, pp. 893–896, XP002260338.

K.A. Schouhamer Immink; "Codes Fo Mass Data Storage Systems", 1999, Shannon Foundation Publishers, Netherlands, XP002260339.

K.A. Shouhamer Immink, "A Practical Method for Approaching the Channel Capacity of Constrained Channels", IEEE Trans. Inform. Theory, vol. IT–43, No. 5, pp. 1389–1399, Sep. 1997.

* cited by examiner

*Primary Examiner*—Brian Young

(57) ABSTRACT

The invention relates to a modulation code system, including an encoder and a decoder and two corresponding modulation code methods. More specifically, the encoder 100 serves for transforming an original signal s into an encoded signal c satisfying predefined second constraints. Such encoder signals are, for example, transmitted via a channel 300 or stored on a recording medium. After receipt or restoration, said encoded signal c is decoded by a decoder 200 in order to regenerate the original signal s again. It is the object of the present invention to improve the known modulation code systems and methods in such a way that their embodiment requires less hardware. This object is solved in that the encoder 100 comprises a series connection of a modulation code encoder 110 and of a transformer encoder 120 allowing an N-time integration of the output signal of said modulation code encoder 110. Moreover, this object is solved by embodying the decoder 200 by a series connection of a transformer decoder 220 for N-times differentiating the encoded signal c, and a modulation code decoder 210. N is an integer greater than 1.

13 Claims, 5 Drawing Sheets

MODULATION CODE SYSTEM AND METHODS OF ENCODING AND DECODING A SIGNAL BY MULTIPLE INTEGRATION

The invention relates to a modulation code system as shown in FIG. 6, including an encoder 100 for transforming an original signal s into an encoded signal c satisfying predefined second constraints before being transmitted via a channel 300 or stored on a recording medium. The modulation code system further comprises a decoder 200 for decoding the encoded signal c after restoration or receipt back into the original signal s.

Such a modulation code system known in the art is substantially used in data transmission systems or data storage systems.

The invention further relates to known methods of operating the encoder 100 and the decoder 200.

Traditionally, encoders or decoders of modulation code systems use specific modulation methods, e.g. the enumerative encoding method or the integrated scrambling method. The enumerative encoding method is e.g. known from K. A. S. Immink, "A practical method for approaching the channel capacity of constrained channels", IEEE Trans. Inform. Theory, vol. IT-43, no. 5, pp. 1389–1399, September 1997. The integrated scrambling method is e.g. known from K. A. S. Immink, "Codes for mass data storage systems", Shannon Foundation Publishers, The Netherlands, 1999.

These methods allow the transformation of the original signal s into the signal c satisfying yxc complicated constraints and back, usually at a modulation code rate close to 1. The rate of a modulation code is a number that refers to the average number of encoded signals per source symbol: for example, an encoder of rate ½ code produces (on average) two encoded symbols for each source symbol.

At least the decoder of such known modulation code systems is usually implemented in hardware so as to allow high speed operation. However, hardware implementation of the above-mentioned modulation code methods disadvantageously requires quite a lot of hardware, e.g. to store the required tables.

Starting from the prior art, it is the object of the invention to improve a known modulation code system and known methods of operating an encoder and a decoder of said modulation code system such that they require less hardware.

This object is solved as defined in claim 1 by embodying the encoder such that it comprises a modulation code encoder for transforming the original signal s into an intermediate signal t satisfying predefined first constraints and a transformer encoder for N-times integrating said intermediate signal t in order to generate said encoded signal c and by embodying the decoder such that it comprises a transformer decoder for N-times differentiating the encoded signal c after restoration in order to regenerate said intermediate signal t and a modulation code decoder for decoding said intermediate signal t into said original signal s, N being an integer greater than 1.

The first constraints may in general be simpler, equal or more complicated than the second constraints. However, in preferred embodiments, the first constraints are usually simpler than the second constraints.

The claimed design of the modulation code system, in particular the series connection of the modulation code encoder with the transformer encoder within said encoder and the series connection of the transformer decoder with said modulation code decoder within said decoder, ensures that the hardware expense for implementing the encoder and the decoder is advantageously essentially reduced.

The object is further solved by the encoder as defined in claim 2. The above-mentioned advantage applies to said encoder as well.

An example of a simple and less expensive implementation of the encoder is defined in claim 3.

The encoder is preferably implemented in hardware in order to ensure a high operation speed.

The method is especially well-suited for a modulation code rate close to one. In that case, the modulation code encoder as well as the transformer encoder must both have a modulation code rate close to 1 because the modulation code rate of the entire encoder corresponds to the product of the modulation code rates of the modulation code encoder and the transformer encoder.

Advantageously, the modulation code encoder is a (0,k)-encoder; in that case, the intermediate signal t is (0,k)-constrained and thus the first constraints satisfy very simple constraints.

The object of the invention is further solved by an encoding method as defined in claim 7 for transforming an original signal s into an encoder signal c satisfying predefined second constraints. The advantages of said encoding method correspond to the above-mentioned advantages of the encoder.

The object of the invention is further solved by the decoder as defined in claim 8. The advantages of said decoder, namely that less hardware is required for implementing said decoder, correspond to the advantage mentioned above.

The transformer decoder represents a sliding block decoder.

The transformer decoder is preferably at least partly implemented in hardware in order to achieve a high operation speed.

In a very simple embodiment, the modulation code decoder is a (0,k)-decoder with the result that it decodes a simple (0,k)-pattern constrained intermediate signal t back into the original signal s.

Further advantageous embodiments of the invention are defined in the dependent claims.

Finally, the object of the invention is solved by the decoding method as defined in claim 13; the advantages of this method correspond to the advantages of the decoder mentioned above.

Six Figures accompany the description, wherein

Several embodiments of the modulation code system according to the invention will hereinafter be described with reference to FIGS. 1 to 5. More specifically, the hardware design of the modulation code system will be described with reference to FIGS. 1 to 3, and the operation thereof will be described with reference to FIGS. 4 and 5.

Figure 1:
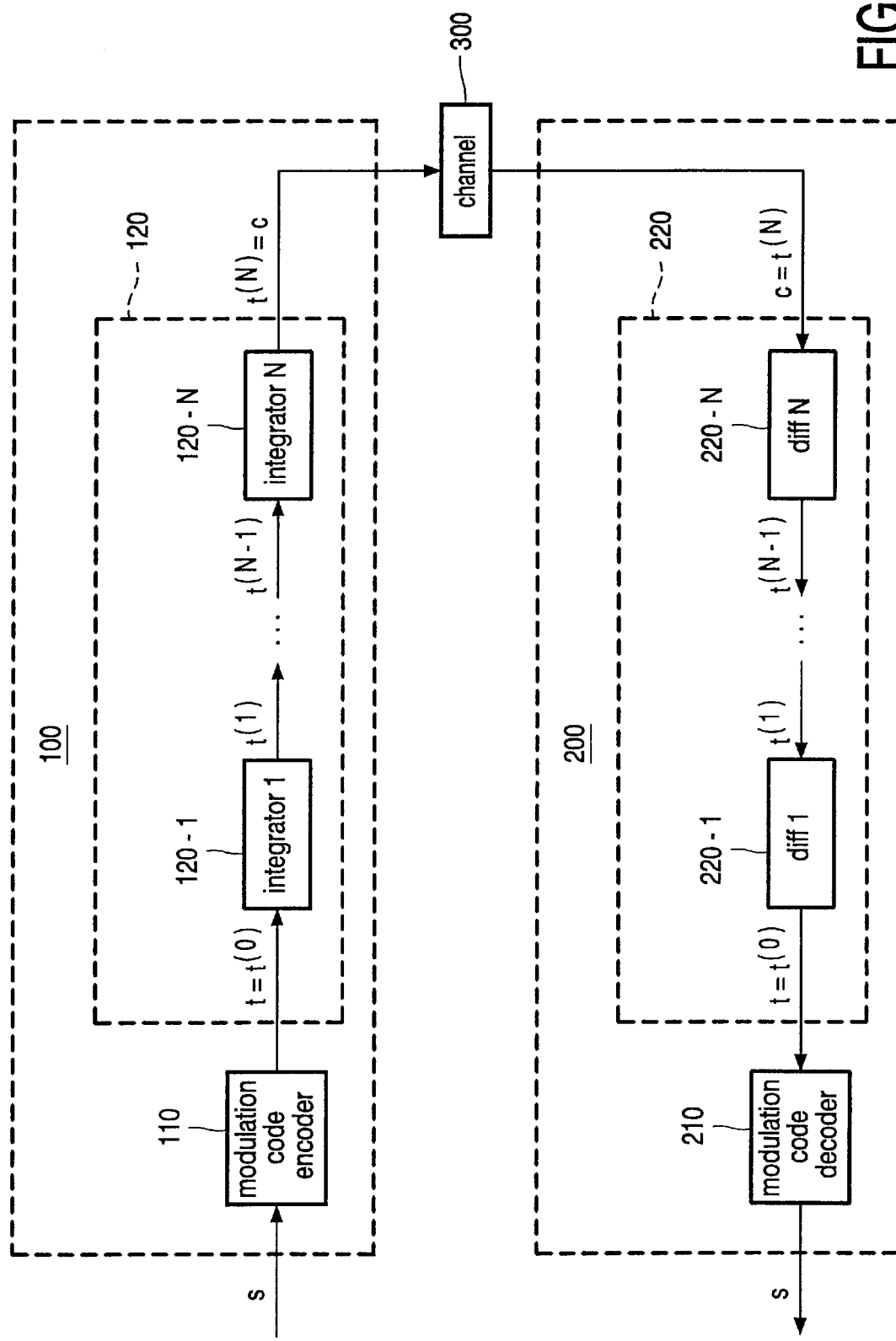
FIG. 1 shows a modulation code system according to the present invention.

FIG. 1 shows a modulation code system according to the present invention. The system comprises a modulation code encoder 110 for transforming the original signal s into an intermediate signal t satisfying predefined first constraints, and a transformer encoder 120 for transforming said intermediate signal t into an encoder output signal c of said encoder 100, the signal c satisfying second constraints. Said transformer encoder 120 comprises a series connection of N integrators 120-1, . . . 120-N for N-times integrating said intermediate signal t. A memory (not shown) for latching the signal t before it is output to said transformer encoder 120 might be provided between said modulation code encoder 100 and said transformer encoder 120.

The encoder signal c as output from said encoder 100 is e.g. transmitted via a channel 300 or stored on a recording medium (not shown).

After receipt or restoration, said encoded signal c is received by a decoder 200. In said decoder 200, said encoded signal c is first transformed by a transformer decoder 220 back into said intermediate signal t. Subsequently, said intermediate signal is demodulated by a modulation decoder 210 back into said original signal s. A memory (not shown) for latching said intermediate signal t might be provided between said transformer decoder 220 and said modulation code decoder 210.

The transformer decoder 220 comprises a series connection of N-differentiators for 220-1, . . . 220-N for N-times differentiating the encoder signal c after restoration in order to generate said intermediate signal t.

In the following detailed description of FIGS. 2 to 5, the signals s, t and c are assumed by way of example to be sequences of bits $s_j$, $t_j$ and $c_j$, respectively, wherein the parameter j represents a clock of the signals or sequences.

Figure 2:
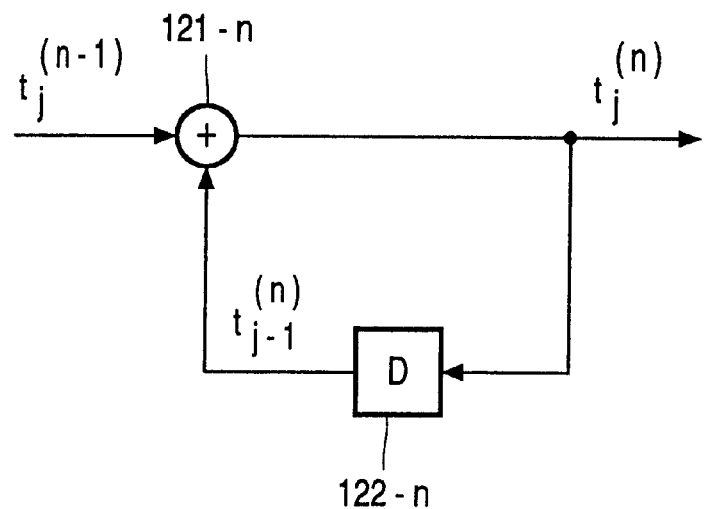
FIG. 2 shows an embodiment of an integrator.

FIG. 2 shows an embodiment for one of said integrators 120-$n$ with n=1–N. Such an integrator 120-$n$ comprises a logic XOR-gate 121-$n$ and a delay element 122-$n$. The delay element 122-$n$ serves for generating a signal $t^{(n)}$ representing a sequence of bits $$t^{(n)}_{j-1}.$$

The delay element 122-$n$ may e.g. be embodied as a flip-flop. The signal $t^{(n)}$ corresponds to the intermediate signal $t=t^{(0)}$ after having n-times been integrated. The bits $$t^{(n)}_{j-1}$$

are fed back to said logic XOR-gate 121-$n$ for being XOR-combined with bits $$t^{(n-1)}_j$$

of a signal $t^{(n-1)}$ which corresponds to the intermediate signal t after having n-1 times been integrated. The result of said XOR-combination represents the output of said integrator 120-$n$.

Figure 3:
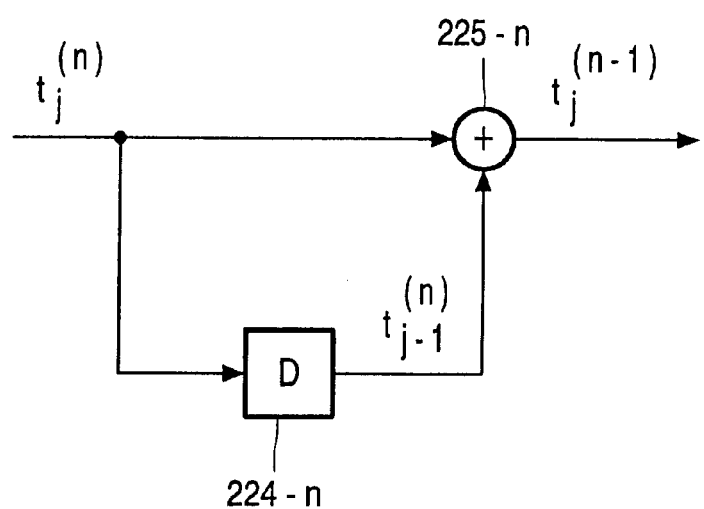
FIG. 3 shows an embodiment of a differentiator.

FIG. 3 shows an embodiment for a differentiator 220-$n$ as cascaded in said transformer decoder 220. According to said embodiment, the differentiator 220-$n$ comprises a delay element 224-$n$ for receiving bits $$t^{(n)}_j$$

of a differentiator input signal $t^{(n)}$ and for generating an output signal representing a sequence of bits. Here, the delay element 224-$n$ may also be embodied as a flip-flop. Furthermore, said embodiment of the differentiator comprises a logic XOR-gate 225-$n$ for logically XOR-combining the output signal of said delay element 224-$n$ with the bits $$t^{(n)}_j$$

of said differentiator input signal $t^{(n)}$ in order to generate a sequence of differentiator output bits $$t^{(n-1)}_j.$$

The operation of the encoder 100 and the decoder 200 will be explained in more detail with reference to FIGS. 4 and 5.

Figure 4:
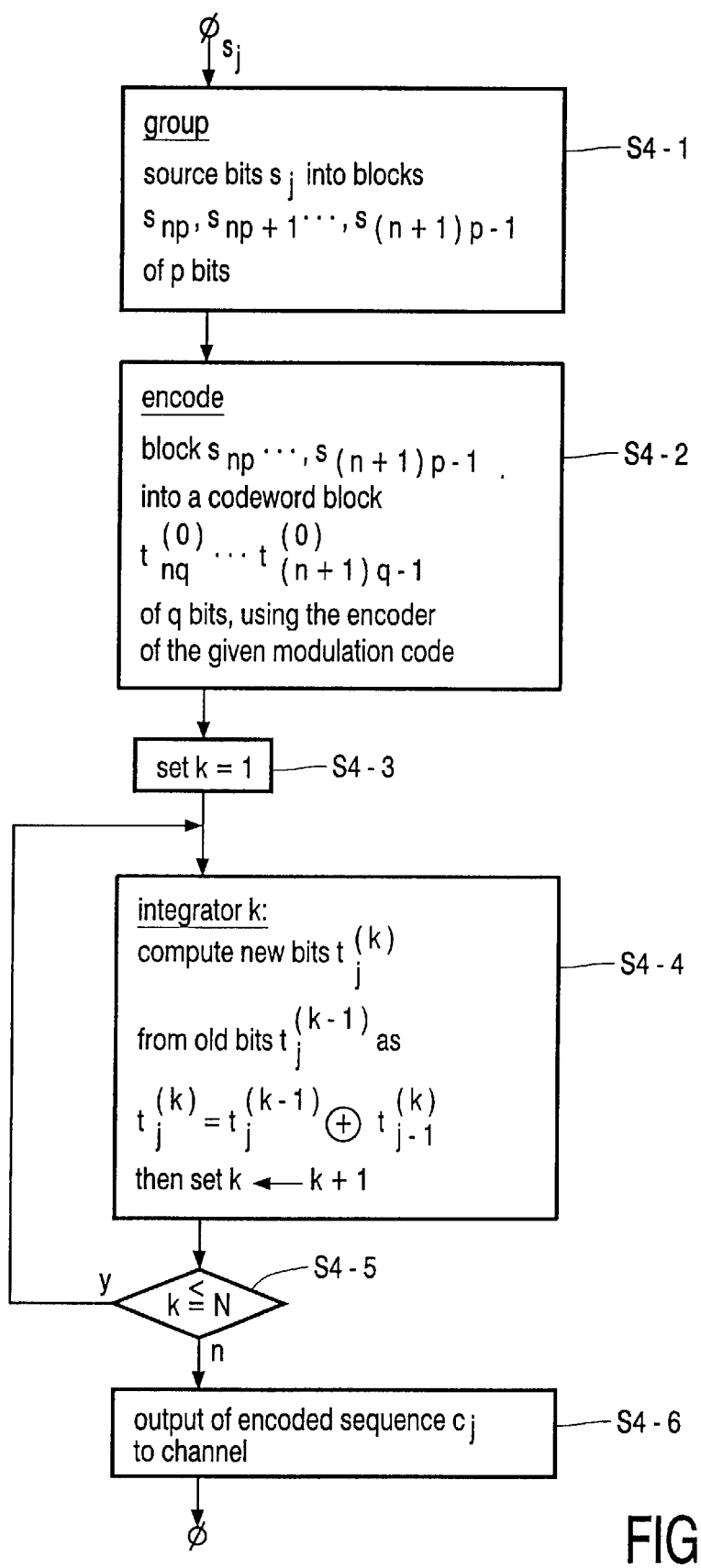
FIG. 4 shows a flow chart illustrating the encoding process according to the present invention.

In FIG. 4, the operation of the modulation code encoder 110 and of the transformer encoder 120 is explained in more detail. More specifically, the modulation code encoder 110 receives the original input signal s, the source bits $s_j$ of which are grouped into blocks $s_{np}$, $s_{np+1}$, . . . , $s_{(n+1)p-1}$ of p bits, respectively (see method step S4-1).

Subsequently, these blocks are—according to method step S4-2—encoded into a code word block $$t^{(0)}_{nq} \ldots t^{(0)}_{(n+1)q-1}$$

of q bits, respectively. Said encoding is done in the encoder 110 using a given modulation code with a modulatuion code rate p/q. As a result, the intermediate signal $t=t^{(0)}$ representing a sequence of bits $$t^{(0)}_j$$

is generated.

In method step S4-3, an integration parameter k is set to 1 before a first integration is carried out. The parameter k generally represents the number of the integration step which is currently carried out in said transformer encoder 120. Subsequently, an integration step is carried out in said transformer encoder 120 by computing new bits $$t^{(k)}_j$$

from previous bits $$t^{(k-1)}_j$$

in accordance with the following equation (see method step S4-4):

$$t^{(k)}_j = t^{(k-1)}_j \oplus t^{(k)}_{j-1}$$

wherein ⊕ represents an XOR-combination.

Subsequently, the integration parameter k is set to k+1. Said new setting of k is compared with a predetermined number N of integrations which shall in total be carried out in said transformer encoder 120 in accordance with method step S4-5. In the case where said predetermined number N of integrations has not yet been carried out, method steps S4-4 and S4-5 are repeated as often as necessary in that finally a total of N integrations has been carried out. After that, the encoded signal c resulting from said N-times integration process and representing a sequence of bits $c_j$ is output to the channel 300 or stored on a recording medium (not shown).

Figure 5:
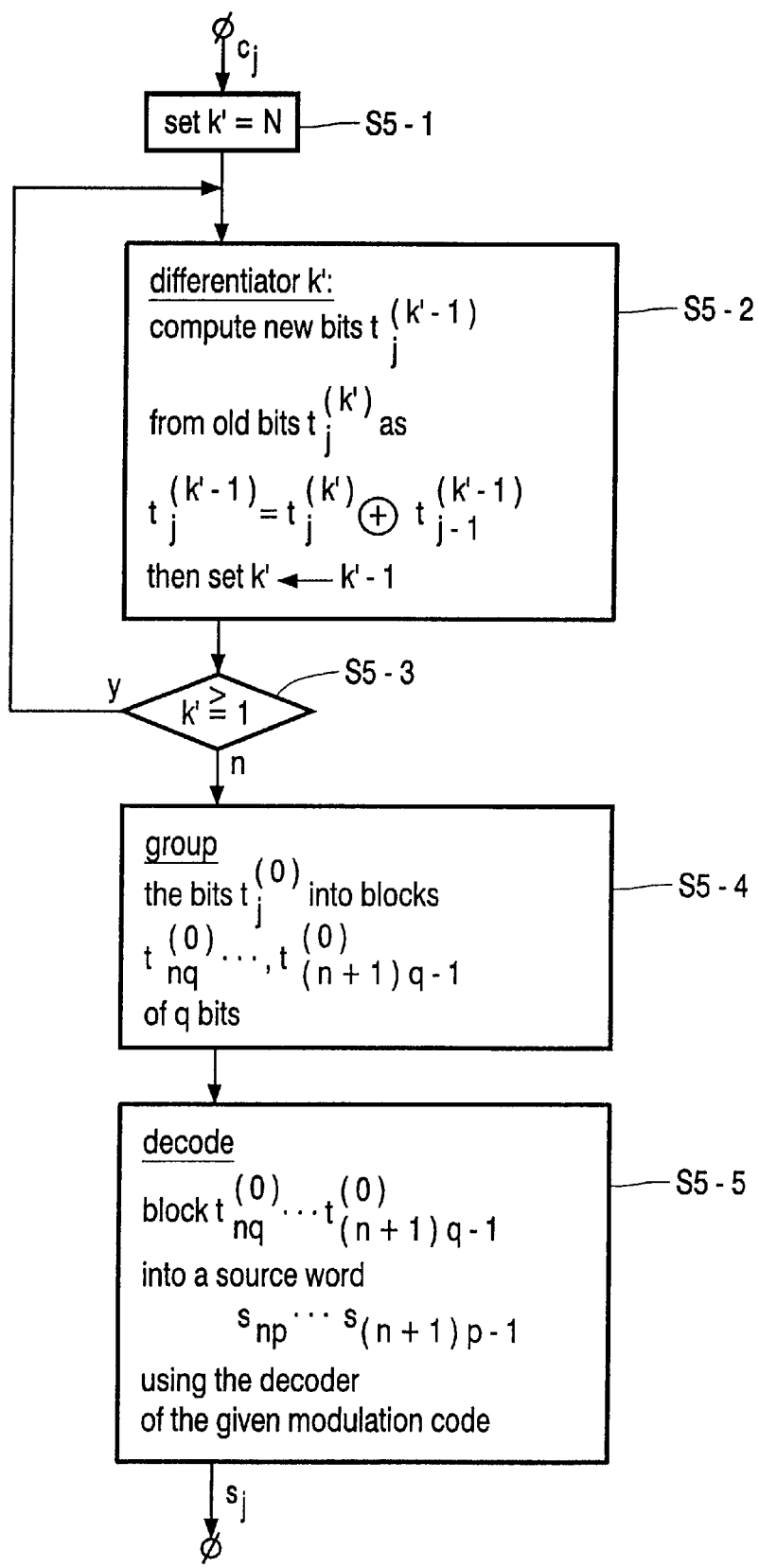
FIG. 5 shows a flow chart illustrating the decoding process according to the present invention.
Figure 6:
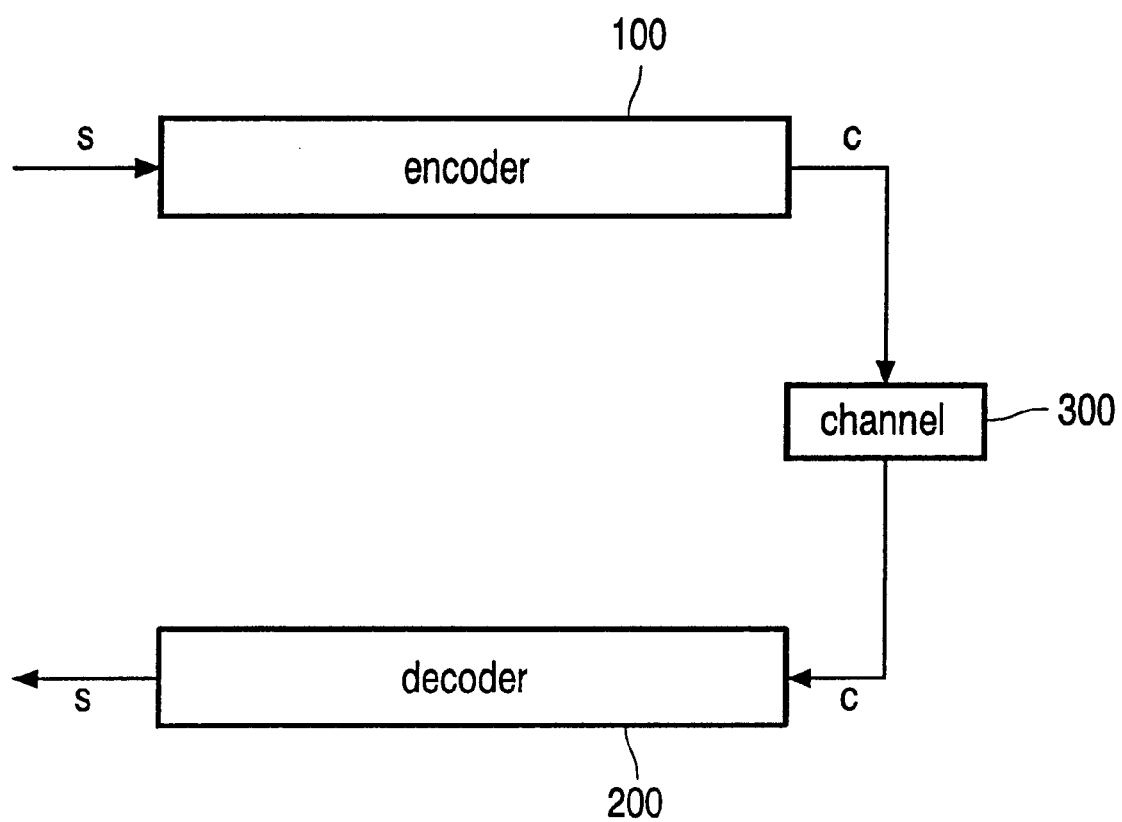
FIG. 6 shows a modulation code system as known in the art.

FIG. 5 illustrates the operation of the transformer decoder 220 and of the consecutive modulation code decoder 210 as part of the decoder 200. In general, said decoder 200 carries out an inversive operation of the encoder 100 as illustrated in FIG. 4.

According to FIG. 5, the transformer decoder 220 receives the encoded signal c after transmission via said channel 300 or after restoration from said recording medium. First, a differentiation parameter k', is set to N, representing a predetermined number of differentiations corresponding to the predetermined number of integrations as carried out in the encoder 100. This initialization is done in method step S5-1.

After said initialization, a first differentiation is carried out by differentiator 220-N in accordance with method step S5-2. More specifically, said differentiation is done by computing new bits $$t_j^{k'-1}$$

from old bits $$t_j^{k'}$$

in accordance with the following equation:

$$t_j^{(k-1)} = t_j^{(k)} \oplus t_j^{(k-1)})$$

wherein $\oplus$ represents an XOR-combination.

Subsequently, said differentiation parameter k', is reduced by 1 and then compared with 1 in method step S5-3. In the case where the comparison in method step S5-3 leads to the result that the predetermined number N of differentiations has not yet been carried out, method steps S5-2 and S5-3 are repeated in the cascaded differentiators 220-(N–1), . . . , 220-1.

On the contrary, in the case where the comparison in method step S5-3 leads to the result that N differentiations have sequentially been carried out, the resulting intermediate signal $$t_j^0 = t_j$$

is input to the modulation code decoder 210. There, the bits of said intermediate signal $$t_j^0$$

are—according to method step S5-4—grouped into blocks $$t_{nq}^{(0)} \ldots t_{(n+1)q-1}^{(0)}$$

of q bits, respectively.

Finally, said blocks are decoded according to method step S5-5 into a source word $s_{np}, \ldots, s_{(n+1)p-1}$ of the original signal $s_j$. This decoding step S5-5 is done by using the modulation code decoder 210 of the predetermined modulation code.

The operation of the transformer encoder 120 will be illustrated by giving two examples. However, before providing these two examples, a short introduction to basic definitions will be given. For a simplified illustration, a signal is hereinafter also referred to as sequence.

A signal satisfying simple constraints is, for example, a (0,k)-constrained signal which is a binary signal where the number of consecutive zeros is at most k. On the contrary, a signal satisfying complicated constraints is a signal having obeying run-length constraints on more complicated patterns, like e.g. the transition patterns of the anti-whistle patterns as listed in table 1.

TABLE 1

Anti-whistle transition patterns.

| index | anti-whistle transition pattern | period |
|---|---|---|
| 1 | 0 | 1 |
| 2 | 1 | 1 |
| 4[a] | 01 | 2 |
| 4[b] | 0011 | 4 |
| 3 | 011 | 3 |
| 6 | 001 | 3 |

Runlength-limited RLL codes are widely applied in digital transmission and recording systems. RLL sequences are characterized by two parameters: d and k, which specify the minimum and maximum runlengths, respectively. The case in point now is the k constraint. A k-constrained sequence is represented by 1's and 0's, where 1 indicates a transition and 0 indicates no transition. In a k-constrained sequence, the number of consecutive 0's is limited to k. After one-time integration, a data sequence with a maximum run of k+1 identical symbols is formed. The k constraint ensures that data transitions occur regularly and facilitates proper timing recovery. For systems which reject DC components in its spectrum (e.g. digital magnetic recording), the k constraint also ensures that automatic gain control can function properly.

The desire to go for an ever higher data rate and density in transmission and recording systems translates to modern systems which tend to have little excess bandwidth above the Nyquist frequency. For this reason, it is desirable to limit the runlength of the Nyquist-rate data pattern . . . ±±± . . . or . . . ∓∓∓ . . . via a so-called $k_2$ constraint.

Besides timing recovery and automatic gain control, many data receivers also perform adaptive bandwidth control or equalization. For robust equalizer adaptation, at least two distinct frequency components have to be contained in the received sequence. For passband systems (e.g. digital magnetic recording), Table 2 lists all data patterns which have at most a single-frequency component within a passband between (but not including) direct current DC and the Nyquist frequency. Constraints $k_2$, $k_3$, $k_4^a$, $k_4^b$ and $k_6$ are defined to limit patterns with period 2, 3, 4 and 6 symbol intervals. These constraints together are called the anti-whistle constraints. These anti-whistle constraints are already implemented in a channel IC for hard-disk applications using a simple 8-to-9 polarity-bit coder.

After this introduction, the above identified first example is provided. It relates to the multiple intregration on k-constrained sequences.

It is well-known that a k-constrained sequence so after one-time integration produces a sequence $s_1$ with maximum runlength equal to k+1 for the DC sequences. For reasons which will become self-evident later, the alphabet {0,1} is used henceforth.

TABLE 2

Data patterns with at most one spectral component in the passband from DC to the Nyquist frequency. Only a single polarity is shown for each type of pattern, since polarity reversal does not affect the magnitude of the frequency spectrum.

| data pattern | period | anti-whistle constraints | spectral components at |
|---|---|---|---|
| ...+ + + + + + + + + + + +... | 1T | k | DC |
| ...+ − + − + − + − + − + −... | 2T | $k_2$ | 1(2T) |
| ...+ + − + + − + + − + + −... | 3T | $k_3$ | DC, 1/(3T) |
| ...+ + − − + + − − + + − −... | 4T | $k_4^a$ | 1/(4T) |
| ...+ + + − + + + − + + + −... | 4T | $k_4^b$ | DC, 1/(4T), 1/(2T) |
| ...+ + + − − − + + + − − −... | 6T | $k_6$ | 1/(6T), 1/(2T) |

After one-time integration, constrained sequences are
1. $t^{1a}$= ... 111111 ... ,
2. $t^{1b}$= ... 000000 ... , The maximum runlengths for $t^{1a}$ and $t^{1b}$ are equal to k+1.
A second-time integration on $t^1$ produces $t^2$ with constrained sequences:
1. $t^{2a}$= ... 111111 ... (from $t^{1b}$)
2. $t^{2b}$= ... 000000 ... (from $t^{1b}$)
3. $t^{2c}$= ... 101010 ... (from $t^{1a}$)

The maximum runlenghts for $t^{2a}$, $t^{2b}$ and $t^{2c}$ are all equal to k+2.
Likewise, a third-time integration produces from $t^3$ with constrained sequences
1. $t^{3a}$= ... 111111 ... (from $t^{2b}$),
2. $t^{3b}$= ... 000000 ... (from $t^{2b}$),
3. $t^{3c}$= ... 101010 ... (from $t^{2a}$),
4. $t^{3d}$= ... 00110011 ... (from $t^{2c}$).

The maximum runlengths for $t^{3a}$, $t^{3b}$, $t^{3c}$ and $t^{3d}$ are all equal to k+3.
A four-time integration produces $t^4$ with constrained sequences
1. $t^{4a}$= ... 111111 ... (from $t^{3b}$),
2. $t^{4b}$= ... 000000 ... (from $t^{3b}$),
3. $t^{4c}$= ... 101010 ... (from $t^{3a}$),
4. $t^{4d}$= ... 00110011 ... (from $t^{3c}$),
5. $t^{4e}$= ... 00010001 ... (from $t^{3d}$),
6. $t^{4f}$= ... 11101110 ... (from $t^{3d}$).

The maximum runlengths for $t^{4a}$, $t^{4b}$, $t^{4c}$, $t_{4d}$, $t^{4e}$ and $t^{4f}$ are all equal to k+4. After four-times integration, the $k^{4a}$ and $k^{4b}$ constraints are also limited to a runlength of k+4. What is worth noting as well is that after a 4-time integration, the only constrained sequences are those of $t^{4a}$, $t^{4b}$, $t^{4c}$, $t^{4d}$, $t^{4e}$, $t^{4f}$. This implies that no superfluous redundancy has been introduced to include irrelevant constraints.

Obviously, the number of integration may be increased. However, harmless sequences like ... 0000111100001111 ... appear after the $5^{th}$ integration. However, further multiple integration cannot produce sequences with $k_3$ or $k_6$ constraints from an original k-constrained sequence.

Multiple integrations produce sequences with interesting and useful constraints. These results are summarized in Table 3.

TABLE 3

The runlengths of anti-whistle constraints as a function of the number of integration on a sequence $t = t^{(0)}$ with a k-constraint.

| Number of integration | runlength for constraint | | | | | |
|---|---|---|---|---|---|---|
| m | k | k2 | k3 | k4a | k4b | k6 |
| 1 | k + 1 | x | x | x | x | x |
| 2 | k + 2 | k + 2 | x | x | x | x |
| 3 | k + 3 | k + 3 | x | k + 3 | x | x |
| 4 | k + 4 | k + 4 | x | k + 4 | k + 4 | x | x denotes 'unconstrained'.

The advantages of this method include
1. optimum leverage on existing and known methods which produce k-constrained sequences,
2. simple hardware is needed to extend from k-constraint to $k_2$ and $k^{4a}$ and $k^{4b}$ constraints,
3. the same code rate of the original k-constrained sequence is maintained, at a small sacrifice of increase of runlength from k+1 to k+m after m-times integration. While k may be small (e.g. k=6 in simple 16-to-17 coder), the resultant k's may still be acceptable.

The second example for the operation of the transformer encoder 120 will now be provided.

This second example aims at producing sequences which are anti-whistle constrained, by beginning with a sequence $t=t^{(0)}$ with k- and $k^{3a}$-constraints. K+1 denotes the maximum runlength of the sequence ... 111111 ... or ... 000000 ... , and $k^{3a}$+1 denotes the maximum runlength of the sequence ... 110110110 ... . Suppose further k=$k^{3a}$. If they are not equal, it only means the henceforth obtained constrained sequences may have different maximum runlengths.

After one-time integration, constrained sequences are
1. $t^{1a}$= ... 111111 ... ,
2. $t^{1b}$= ... 000000 ... ,
3. $t^{1g}$= ... 110110 ... ,
4. $t^{1h}$= ... 001001 ... , The maximum runlengths for all of these sequences are equal to k+1. A second-time integration on $s_1$ produces $s_2$ with constrained sequences
1. $t^{2a}$= ... 111111 ... (from $t^{1b}$),
2. $t^{2b}$= ... 000000 ... (from $t^{1b}$),
3. $t^{2c}$= ... 101010 ... (from $t^{1a}$),
4. $t^{2g}$= ... 110110 ... (from $t^{1g}$),
5. $t^{2h}$= ... 001001 ... (from $t^{1g}$),
6. $t^{2i}$= ... 0001111 ... (from $t^{1h}$).

The maximum runlengths for all of these sequences are equal to k+2. Likewise, a third-time integration produces from $t^3$ with constrained sequences
1. $t^{3a}$= ... 111111 ... (from $t^{1b}$),
2. $t^{3b}$= ... 000000 ... (from $t^{2b}$),
3. $t^{3c}$= ... 101010 ... (from $t^{2a}$),
4. $t^{3d}$= ... 00110011 ... (from $t^{2c}$),
5. $t^{3g}$= ... 110110110 ... (from $t^{2g}$),
6. $t^{3h}$= ... 001001001 ... (from $t^{2g}$),
7. $t^{3i}$= ... 000111000111 ... (from $t^{2h}$),
8. $t^{3j}$= ... 00001011110000101111 ... (from $t^{2i}$).

The maximum runlength for these sequences are equal to k+3. It should be emphasized that sequence $t^{3j}$ is a 'harmless' sequence whose runlength is limited as a by-product. A four-time integration produces $t^4$ with constrained sequences
1. $t^{4a}$= ... 111111 ... (from $t^{3b}$),
2. $t^{4b}$= ... 000000 ... (from $t^{3b}$),
3. $t^{4c}$= ... 101010 ... (from $t^{3a}$), 4. $t^{4d} = \ldots 00110011 \ldots$ (from $t^{3c}$),
5. $t^{4e} = \ldots 00010001 \ldots$ (from $t^{3d}$),
6. $t^{4f} = \ldots 11101110 \ldots$ (from $t^{3d}$),
7. $t^{4g} = \ldots 110110110 \ldots$ (from $t^{3g}$),
8. $t^{4h} = \ldots 001001001 \ldots$ (from $t^{3g}$),
9. $t^{4i} = \ldots 000111000111 \ldots$ (from $t^{3h}$),
10. $t^{4j} = \ldots 00001011110000101111 \ldots$ (from $t^{3i}$),
11. $t^{4k} =$
  0000110101111100101000001101011111001010 $\ldots$
  (from $t^{3j}$).

The maximum runlengths for all of these sequences are equal to k+4. All sequences are anti-whistle constrained. However, extra 'harmless' sequences $t^{4j}$ and $t^{4k}$ are also included in the list of constrained sequences, which implies that unnecessary redundancy in the code rate has been introduced.

Though the invention is described with reference to preferred embodiments thereof, it is to be understood that these are non-limitative examples. Thus, various modifications are conceivable to those skilled in the art, without departing from the scope of the invention, as defined by the claims.

Use of the verb "comprise" and its conjugations does not exclude the presence of elements or steps other than those stated in a claim. Furthermore, use of the article "a" or "an" preceding an element does not exclude the presence of a plurality of such elements. In the claims, any reference signs placed between parenthesis shall not be construed as limiting the scope of the claims. The invention may be implemented by means of hardware as well as software. Several "means" may be represented by the same item of hardware. Furthermore, the invention resides in each and every novel feature or combination of features.

What is claimed is:

1. A modulation code system comprising
    an encoder for transforming an original signal into an encoded signal satisfying at least one predefined constraint before being transmitted via a channel or stored on a recording medium; and
    a decoder for decoding the encoded signal after restoration back into the original signal;
    wherein the encoder includes a modulation code encoder for transforming the original signal into an intermediate signal satisfying at a second predefined constraint, and a transformer encoder for integrating said intermediate signal to generate said encoded signal; and
    the decoder includes a transformer decoder for differentiating the encoded signal after restoration to regenerate said intermediate signal, and a modulation code decoder for decoding said intermediate signal into said original signal.

2. An encoder, characterized by a modulation code encoder for transforming an original signal into the intermediate signal satisfying a first predefined constraint; and by
    a transformer encoder for integrating said intermediate signal in order to generate an encoded signal.

3. The encoder as claimed in claim 2, wherein the transformer encoder comprises a cascade of N integrators each of which comprises a logic XOR-Gate and a delay element, respectively, said delay element generating an integrator output signal $t^{(n)}$ which is fed back to said logic XOR-gate so as to be XOR-combined with a received integrator input signal $t^{(n-1)}$ in order to generate a signal input to said delay element.

4. The encoder as claimed in claim 2, wherein the transformer encoder is implemented in hardware.

5. The encoder as claimed in claim 2, wherein the encoder has a modulation code rate close to 1.

6. The encoder as claimed in claim 2, wherein the modulation code encoder is an (0,k)-encoder.

7. An encoding method of transforming an original signal into an encoded signal satisfying at least one predefined constraints, the method comprising the following steps:
    transforming the original signal into an intermediate signal satisfying at least a second predefined constraint; and
    integrating the intermediate signal in order to generate an encoded signal.

8. A decoder, characterized by a transformer decoder for differentiating an encoded signal in order to generate an intermediate signal; and
    a modulation code decoder for decoding said intermediate signal into an original signal.

9. The decoder as claimed in claim 8, wherein the transformer decoder comprises a cascade of N-differentiators, each of which comprises, respectively,
    a delay element for receiving bits $$t_j^{(n)}$$

of a differentiator input signal $t^{(n)}$ and generating an output signal; and
    a logic XOR-gate for logically XOR-combining the output signal of said delay element with said differentiator input signal $t^{(n)}$ in order to generate a differentiator output signal $t^{(n-1)}$.

10. The decoder as claimed in claim 8, wherein the transformer decoder is implemented at least partly in hardware.

11. The decoder as claimed in claim 8, wherein the decoder has a modulation code rate close to 1.

12. The decoder as claimed in claim 8, wherein the modulation code decoder is a (0,k)-decoder.

13. A decoding method of decoding a restored encoded signal satisfying at least one predetermined constraint into an original signal satisfying no constraints; characterized by the following steps:
    N-times differentiating the encoded signal in order to generate an intermediate signal satisfying at least a first predetermined constraint, N being an integer greater than 1; and
    decoding the intermediate signal into the original signal.

* * * * *